United States Patent
Jurrissen et al.

(10) Patent No.: US 7,741,846 B2
(45) Date of Patent: Jun. 22, 2010

(54) PARALLEL MAGNETIC RESONANCE IMAGING

(75) Inventors: Michel Paul Jurriaan Jurrissen, Eindhoven (NL); Miha Fuderer, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 730 days.

(21) Appl. No.: 11/571,003

(22) PCT Filed: Jun. 22, 2005

(86) PCT No.: PCT/IB2005/052053
§ 371 (c)(1),
(2), (4) Date: Dec. 20, 2006

(87) PCT Pub. No.: WO2006/003553
PCT Pub. Date: Jan. 12, 2006

(65) Prior Publication Data
US 2009/0163797 A1 Jun. 25, 2009

(30) Foreign Application Priority Data
Jun. 28, 2004 (EP) .................... 04102993

(51) Int. Cl.
*G01V 3/00* (2006.01)
(52) U.S. Cl. ..................... 324/318; 324/309
(58) Field of Classification Search ......... 324/300–322; 600/407–445
See application file for complete search history.

(56) References Cited

U.S. PATENT DOCUMENTS

| | | | |
|---|---|---|---|
| 5,119,027 A | 6/1992 | Ehrhardt | |
| 5,910,728 A * | 6/1999 | Sodickson | 324/309 |
| 6,242,916 B1 | 6/2001 | King | |
| 6,380,741 B1 | 4/2002 | Hajnal et al. | |
| 6,710,686 B2 * | 3/2004 | Mertelmeier et al. | 324/314 |
| 6,980,001 B2 * | 12/2005 | Paley et al. | 324/318 |
| 7,411,395 B2 * | 8/2008 | Hennig | 324/307 |
| 7,417,429 B2 * | 8/2008 | Fuderer et al. | 324/309 |
| 2002/0014889 A1 | 2/2002 | Prussmann et al. | |
| 2002/0153890 A1 | 10/2002 | Madore | |
| 2009/0033327 A1 * | 2/2009 | Aldefeld et al. | 324/309 |
| 2009/0163797 A1 * | 6/2009 | Jurrissen et al. | 600/410 |

FOREIGN PATENT DOCUMENTS

WO 03 046598 A1 6/2003

OTHER PUBLICATIONS

Jurrissen, M., et al.; Diamond-SENSE: undersampling on a crystallographic grid; 2004; Proc. Intl. Soc. Mag. Reson. Med.; 11; p. 2643.
Pruessmann, K. P., et al.; SENSE: Sensitivity Encoding for Fast MRI; 1999; MRM; 42:952-962.

* cited by examiner

*Primary Examiner*—Brij B Shrivastav

(57) ABSTRACT

The invention relates to a device (1) for magnetic resonance imaging of a body (7) placed in a stationary and substantially homogeneous main magnetic field. In order to provide an MR device (1) which is arranged to automatically select an optimum subsampling scheme for three-dimensional SENSE, the invention proposes to select the subsampling scheme such that the maximum number of folded-over image values is minimized and simultaneously distances between the positions of the folded-over image values within the predetermined field of view are maximized.

13 Claims, 2 Drawing Sheets

PARALLEL MAGNETIC RESONANCE IMAGING

Figure 1:
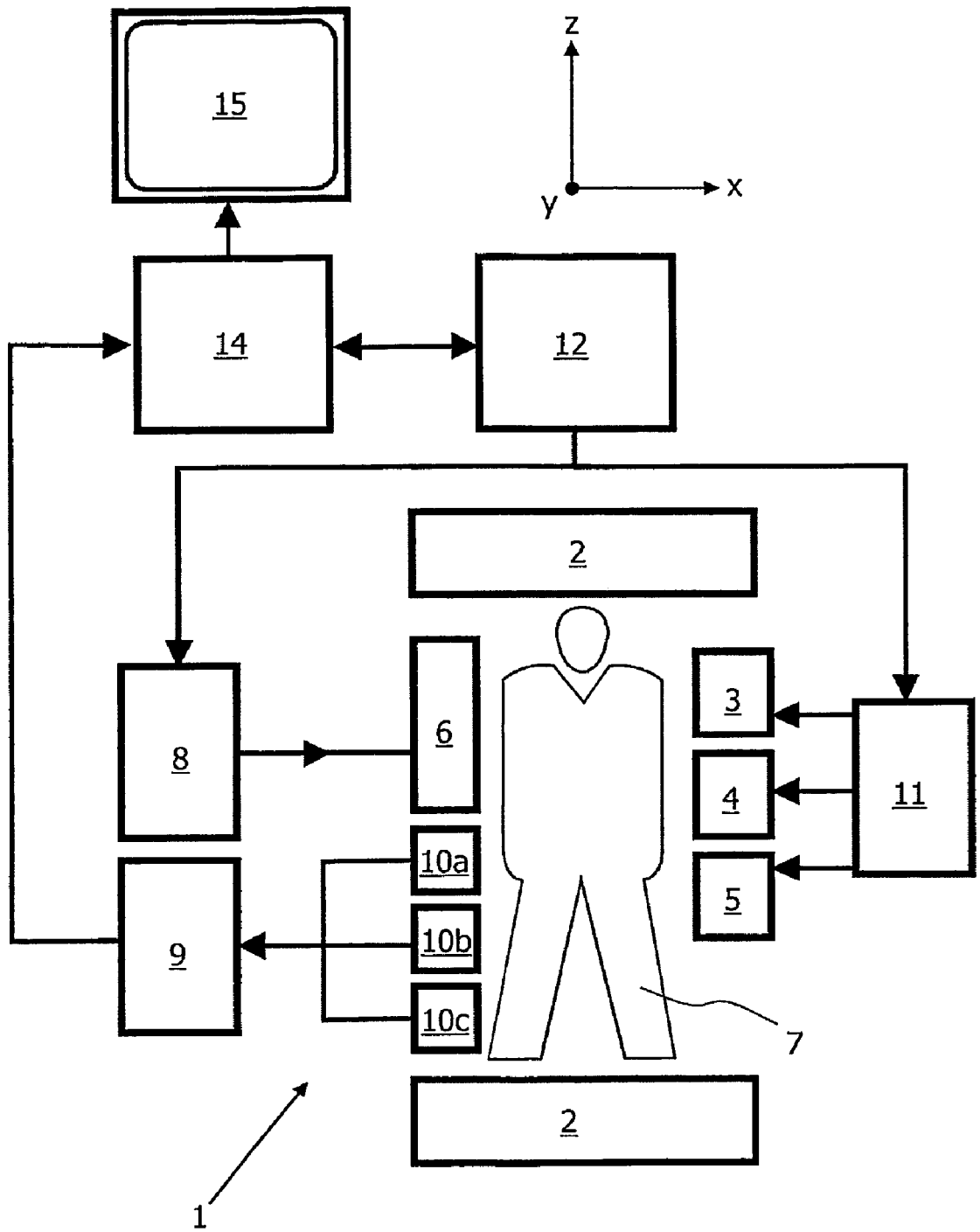

The invention relates to a device for magnetic resonance imaging of a body placed in a stationary and substantially homogeneous main magnetic field.

Furthermore, the invention relates to a method for magnetic resonance imaging and to a computer program for a magnetic resonance imaging device.

In magnetic resonance imaging (MRI), pulse sequences consisting of RF and magnetic field gradient pulses are applied to an object (a patient) to generate phase encoded magnetic resonance signals, which are scanned by means of receiving antennas in order to obtain information from the object and to reconstruct images thereof. Since its initial development, the number of clinical relevant fields of application of MRI has grown enormously. MRI can be applied to almost every part of the body, and it can be used to obtain information about a number of important functions of the human body. The pulse sequence which is applied during an MRI scan determines completely the characteristics of the reconstructed images, such as location and orientation in the object, dimensions, resolution, signal-to-noise ratio, contrast, sensitivity for movements, etcetera. An operator of an MRI device has to choose the appropriate sequence and has to adjust and optimize its parameters for the respective application.

In known parallel MRI techniques, multiple receiving antennas with different spatial sensitivity profiles are employed to reduce the scan time for a diagnostic image. This is achieved by acquiring a smaller set of phase encoded magnetic resonance signals than would actually be necessary to completely cover the predetermined field of view in accordance with Nyquist's theorem.

In the known so-called SENSE technique (see for example Pruessmann et al, Magnetic Resonance in Medicine, volume 42, page 952, 1999), magnetic resonance signals are acquired in a subsampled fashion while using multiple surface receiving coils of a magnetic resonance device. The phase encoding steps in the k-space are increased relative to the phase encoding steps actually required for the complete predetermined field of view in geometrical space. This subsampling results in a reduced field of view. In conformity with the SENSE technique, images are reconstructed from the subsampled data separately for each receiving coil. Because of the subsampling, these intermediary images contain fold-over or so-called aliasing phenomena. On the basis of the known spatial sensitivity profiles of the receiving coils, the individual contributions to the folded-over image values of the intermediate images can be decomposed (unfolded) by means of matrix computations into image values at spatial positions within the full field of view. In this way, the spatial encoding of the acquired magnetic resonance signals by the spatial sensitivity profiles of the receiving coils is made use of in order to considerably accelerate the image acquisition procedure. When the known SENSE technique is employed for the computation of the final image of the complete field of view, the ratio of the dimensions of the full field of view relative to the reduced field is also referred to as reduction factor or simply as SENSE factor.

The above-described known SENSE technique can also be applied for three dimensional imaging (so-called 3D SENSE). In this case, subsampling is applied in two phase encoding directions, for example the y- and the z-directions of the cartesian coordinate system of the MRI apparatus. Consequently, there are two independent reduction factors, usually referred to as $R_y$ and $R_x$. It is a known problem in both 2D and 3D SENSE that the distances between positions within the field of view that have to be unfolded during the SENSE reconstruction become small at high SENSE factors. Due to the correspondingly small differences between the local sensitivities of the receiving antennas, this results in undesirable image artifacts because of unstable matrix inversions. In 3D SENSE the distances between the folded-over positions are generally larger than in the 2D case. Nonetheless, the problem occurs that depending on the selection of the independent reduction factors $R_y$ and $R_z$, the number of folded-over image values (so-called local SENSE factor) varies a lot over the predetermined field of view. As a result, the image quality is not constant over the complete image. In some regions of the reconstructed image, the matrix inversion computations of the SENSE algorithm may even be underdetermined which has a very adverse effect on local image quality.

Therefore it is readily appreciated that there is a need for an improved device for magnetic resonance imaging which enables the acquisition and reconstruction of high quality three-dimensional MR images using the SENSE technique. It is consequently the primary object of the present invention to provide an MR device which is arranged to automatically select the subsampling scheme such that high local SENSE factors are avoided.

In accordance with the present invention, a device for magnetic resonance imaging of a body placed in a stationary and substantially homogeneous main magnetic field is disclosed. The device is provided with receiving antennas which have different sensitivity profiles for receiving phase encoded magnetic resonance signals from the body. The device of the invention is arranged to acquire the magnetic resonance signals with subsampling in two phase encoding directions in correspondence with a predetermined field of view, reconstruct a three-dimensional image containing folded-over image values, and calculate image values at spatial positions within said field of view from the folded-over image values and from the sensitivity profiles of the receiving antennas. Therein the scheme of subsampling is selected such that the maximum number of folded-over image values is minimized and simultaneously the distances between the positions of the folded-over image values are maximized.

The invention advantageously enables the generation of high quality MR images using 3D sense, wherein the subsampling scheme in the two phase encoding directions is selected automatically, for example on the basis of an overall SENSE factor as prescribed by a user of the MR device. The invention is based upon the insight that the quality of the finally obtained image is optimum when the maximum number of the folded-over image values (local SENSE factor) is minimized and simultaneously the distance between the folded-over image positions (so-called folding distance) is maximized. Since the mutual dependencies between the reduction factors, the resulting local SENSE factors and the distances between the folded-over image positions are theoretically known as such, it is easily possible to enable the automatic selection of the subsampling scheme in accordance with the present invention by means of an appropriate programming of the computer means of the magnetic resonance imaging device.

In accordance with the present invention it is advantageous to select the scheme of subsampling in the two phase encoding directions such that it corresponds to a triangular grid in k-space. In 3D SENSE the sampling of k-space in the phase encoding directions on a non-rectangular grid makes it possible to achieve arbitrary and even non-integer reduction factors. Furthermore, the triangular grid is ideal for use in accordance with the present invention, since it inherently keeps the distances between the folded-over image positions as large as possible and simultaneously keeps the maximum number of folded-over image values as low as possible. Thereby a more stable matrix inversion during SENSE reconstruction is achieved.

The proposed magnetic resonance imaging technique offers different opportunities to select optimum values for the phase encoding steps $\Delta k_y$ and $\Delta k_z$ in the two phase encoding directions (y- and z-directions). In general, these phase encoding steps obey to the following:

$$\Delta k_y = \frac{R_y}{FOV_y} \text{ and } \Delta k_z = \frac{R_z}{FOV_z},$$

wherein $FOV_y$ and $FOV_x$ represent the dimensions of the predetermined field of view in the two phase encoding directions respectively, and wherein $R_y$ and $R_z$ represent the corresponding reduction factors. For triangular sampling of k-space, the overall SENSE factor in 3D SENSE can be defined as $$S = \frac{1}{2} R_y R_z.$$

In order to optimize the image quality for a given SENSE factor in accordance with the present invention, the reduction factors can be selected in accordance with the following relation:

$$\frac{1}{\sqrt{3}} \frac{FOV_y}{R_y} \leq \frac{FOV_z}{R_z} \leq \sqrt{3} \frac{FOV_y}{R_y}$$

In the two extreme cases of this relation, the folded-over image positions are hexagonally distributed in geometrical space. Thus, the distances between these positions are constant in all directions.

For given reduction factors $R_y$ and $R_z$, the maximum number of folded-over image positions (maximum local SENSE factor), again in the case of triangular sampling of k-space, can be calculated by means of the following equation:

$$S_{max} = \text{ceil}\left(\frac{1}{2} \cdot \text{ceil}(R_y) \cdot \text{ceil}(R_z)\right),$$

wherein the ceil-function yields the lowest integer greater than or equal to its argument. It is practical to select the reduction factors $R_y$ and $R_z$ in accordance with the invention, such that the above relation is fulfilled and simultaneously $S_{max}$ acquires a minimum value.

In most practical cases, the field of view in one phase encoding direction is at least a factor of two larger than in the other phase encoding direction ($FOV_y = 2 FOV_z$). If a triangular sampling scheme is applied in such cases, it turns out to be particularly advantageous to select the reduction factors $R_y$ and $R_z$ for a predetermined overall SENSE factor S', in accordance with $$R_z = 2, R_y = 1 \ldots 7 \text{ for } 1 \leq S \leq 7,$$
$$R_z = 3, R_y = 4.67 \ldots 6 \text{ for } 7 \leq S \leq 9,$$
and
$$R_z = 4, R_y = 4.5 \ldots 8 \text{ for } 9 \leq S \leq 16.$$

By increasing $R_y$ while $R_z$ is an integer a slow increase of the maximum number of folded-over image values is achieved. Thereby, high local SENSE factors are effectively prevented. When $R_z$ increases by a step of one, the folding distance also increases. This helps to further improve image quality. Since $R_z$ can only acquire three different integer values in accordance with the above equations, there are advantageously only two discontinuities when the overall SENSE factor is continuously increased, so that the image quality of the reconstructed images behaves smoothly to the user of the magnetic resonance device of the invention. This advantageously allows the user a selective fine-tuning of the overall SENSE factor.

The invention not only relates to a device but also to a method for magnetic resonance imaging of at least a portion of a body placed in a stationary and substantially homogeneous main magnetic field, the method comprising the following steps:

acquiring magnetic resonance signals with subsampling in two phase encoding directions in correspondence with a predetermined field of view, reconstructing a three-dimensional image containing folded-over image values, and calculating image values at spatial positions within said field of view from the folded-over image values and sensitivity profiles of receiving antennas, wherein the scheme of subsampling corresponds to a triangular grid and is selected such that the maximum number of folded-over image values is minimized and simultaneously the distances between the positions of the folded-over image values within the field of view are maximized.

A computer program adapted for carrying out the imaging procedure of the invention can advantageously be implemented on any common computer hardware, which is presently in clinical use for the control of magnetic resonance scanners. The computer program can be provided on suitable data carriers, such as CD-ROM or diskette. Alternatively, it can also be downloaded by a user from an internet server.

The following drawings disclose preferred embodiments of the present invention. It should be understood, however, that the drawings are designed for the purpose of illustration only and not as a definition of the limits of the invention. In the drawings FIG. 1 shows an embodiment of a magnetic resonance scanner according to the invention, FIG. 2 shows a triangular sampling scheme in accordance with the invention, FIG. 3 shows a diagrammatic representation of the selection of the subsampling scheme in accordance with the invention.

In FIG. 1 a magnetic resonance imaging device 1 in accordance with the present invention is shown as a block diagram. The apparatus 1 comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labelled the z-direction, the two directions perpendicular thereto the x- and y-directions. The gradient coils are energized via a power supply 11. The apparatus 1 further comprises a radiation emitter 6, an antenna or coil, for emitting radio frequency (RF) pulses to a body 7, the radiation emitter 6 being coupled to a modulator 8 for generating and modulating the RF pulses. Also provided are receiving antennas 10a, 10b, 10c for receiving the MR signals, the receiving antennas can for example be separate surface coils with different spatial sensitivity profiles. The received MR signals are input to a demodulator 9. The modulator 8, the emitter 6 and the power supply 11 for the gradient coils 3, 4 and 5 are controlled by a control system 12 to generate the actual imaging sequence for SENSE imaging in accordance with the above-described invention. The control system is usually a microcomputer with a memory and a program control. For the practical implementation of the invention it comprises a programming with a description of an imaging procedure as described above. The demodulator 9 is coupled to a data processing unit 14, for example a computer, for transformation of the received magnetic resonance signals into an image in accordance with the known SENSE unfolding algorithm. This image can be made visible, for example, on a visual display unit 15.

Figure 2:
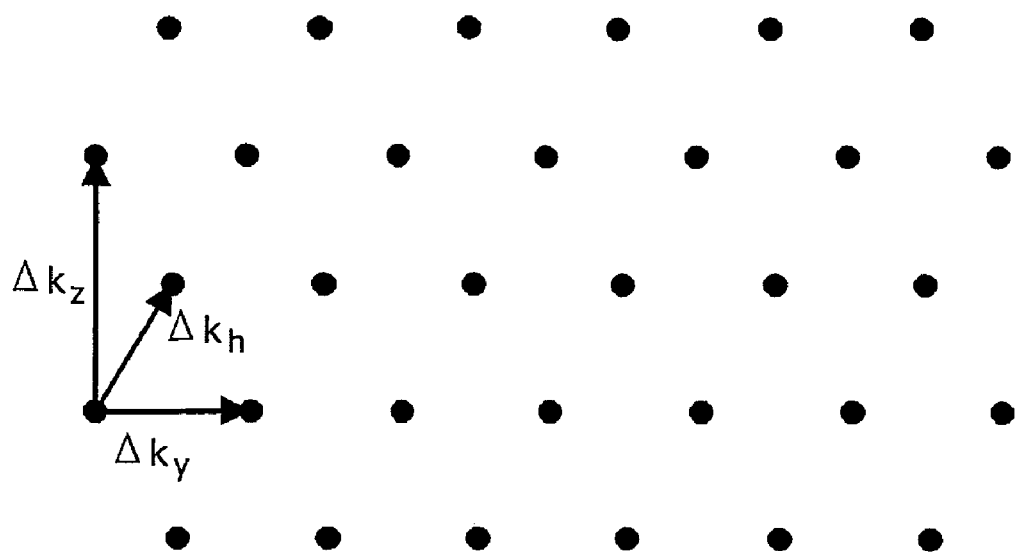
Figure 3:
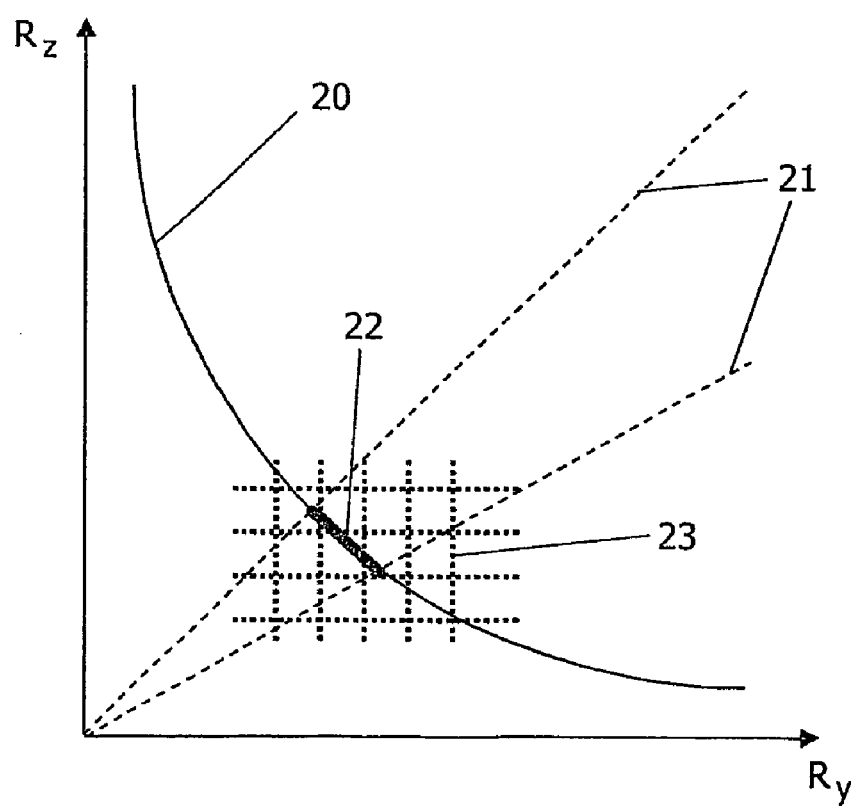

FIG. 2 illustrates a triangular sampling grid in k-space as it can advantageously be employed in accordance with the invention. The vectors $\Delta k_y$, $\Delta k_z$ and $\Delta k_h$ define the depicted triangular grid. $\Delta k_h$ points to the center of the square defined by $\Delta k_y$ and $\Delta k_z$. For a given field of view defined by the dimensions $FOV_y$ and $FOV_z$ in geometrical space, the following equation applies:

$$\Delta k_y = \frac{R_y}{FOV_y} \text{ and } \Delta k_z = \frac{R_z}{FOV_z},$$

wherein $R_y$ and $R_z$ represent the reduction factors of subsampling in the respective directions.

The diagram of FIG. 3 visualizes the automatic selection of the optimum triangular subsampling scheme in accordance with the invention. The curve 20 shows the mutual dependency of $R_y$ and $R_z$ for a given overall SENSE factor obeying to the equation $$S = \frac{1}{2} R_y R_z.$$

S might for example be prescribed by the user of an MR device featuring the invention. In the area of the diagram as defined by the two dashed lines 21, the relation $$\frac{1}{\sqrt{3}} \frac{FOV_y}{R_y} \leq \frac{FOV_z}{R_z} \leq \sqrt{3} \frac{FOV_y}{R_y}$$

is fulfilled. In this region the distances between folded-over image position are maximum. The combination of the reduction factors $R_y$ and $R_z$ lying on the section 22 of the curve 20 is to be selected such that the folding distance is optimized in terms of image quality. The grid 23 depicted in FIG. 3 illustrates areas with different maximum numbers $S_{max}$ of folded-over image positions. In the embodied case of triangular sampling of k-space, the maximum local SENSE factor $S_{max}$ can be calculated in the different areas according to the equation $$S_{max} = \text{ceil}\left(\frac{1}{2} \cdot \text{ceil}(R_y) \cdot \text{ceil}(R_z)\right).$$

For optimum image quality the reduction factors $R_y$ and $R_z$ lying on the section 22 are automatically selected for which $S_{max}$ acquires a minimum value.

The invention claimed is:

1. A device for magnetic resonance imaging of a body placed in a stationary and substantially homogeneous main magnetic field, with receiving antennas for receiving phase encoded magnetic resonance signals from the body, which receiving antennas have sensitivity profiles, wherein the device is configured to:
   select a scheme of subsampling such that the maximum number of folded-over image values is minimized and simultaneously the distances between the positions of the folded-over image values are maximized,
   acquire the magnetic resonance signals with subsampling in two phase encoding directions in accordance with the selected scheme of subsampling and in correspondence with a predetermined field of view,
   reconstruct a three-dimensional image containing folded-over image values, and
   calculate image values at spatial positions within said field of view from the folded-over image values and the sensitivity profiles of the receiving antennas.

2. The device of claim 1, wherein the scheme of subsampling in the two phase encoding directions corresponds to a triangular grid.

3. The device of claim 2, wherein phase encoding steps $\Delta k_y$ and $\Delta k_z$ in the two phase encoding directions are employed in accordance with $$\Delta k_y = \frac{R_y}{FOV_y} \text{ and } \Delta k_z = \frac{R_z}{FOV_z},$$

wherein $FOV_y$ and $FOV_z$ represent the predetermined field of view in the two phase encoding directions respectively, and wherein $R_y$ and $R_z$ represent reduction factors being larger than one.

4. The device of claim 3, wherein the select operation selects the reduction factors in accordance with the relation $$\frac{1}{\sqrt{3}} \frac{FOV_y}{R_y} \leq \frac{FOV_z}{R_z} \leq \sqrt{3} \frac{FOV_y}{R_y}.$$

5. The device of claim 3, wherein for a predetermined SENSE factor $$S = \frac{1}{2} R_y R_z,$$

the select operation selects the reduction factors $R_y$ and $R_z$ in accordance with $R_z = 2, R_y = 1 \ldots 7$ for $1 \leq S \leq 7$, $R_z = 3, R_y = 4.67 \ldots 6$ for $7 \leq S \leq 9$, and $R_z = 4, R_y = 4.5 \ldots 8$ for $9 \leq S \leq 16$.

6. A method for magnetic resonance imaging of at least a portion of a body placed in a stationary and substantially homogeneous main magnetic field, the method comprising:

selecting a scheme of subsampling that corresponds to a triangular grid and is selected such that the maximum number of folded-over image values is minimized and simultaneously the distances between the positions of the folded-over image values are maximized;

acquiring magnetic resonance signals with subsampling in two phase encoding directions in accordance with the selected scheme of subsampling and in correspondence with a predetermined field of view;

reconstructing a three-dimensional image containing folded-over image values; and calculating image values at spatial positions within said field of view from the folded-over image values and sensitivity profiles of receiving antennas.

7. The method of claim 6, wherein the selecting comprises:

selecting phase encoding steps $\Delta k_y$ and $\Delta k_z$ in the two phase encoding directions in accordance with $$\Delta k_y = \frac{R_y}{FOV_y} \text{ and } \Delta k_z = \frac{R_z}{FOV_z},$$

wherein $FOV_y$ and $FOV_x$ represent the predetermined field of view in the two phase encoding directions respectively, and wherein $R_y$ and $R_z$ represent reduction factors being larger than one, and wherein the reduction factors are selected in accordance with the relation $$\frac{1}{\sqrt{3}} \frac{FOV_y}{R_y} \leq \frac{FOV_z}{R_z} \leq \sqrt{3} \frac{FOV_y}{R_y}.$$

8. The method of claim 7, wherein for a predetermined SENSE factor $$S = \frac{1}{2} R_y R_z,$$

the selecting comprises:

selecting the reduction factors and $R_y$ and $R_z$ in accordance with $R_z = 2, R_y = 1 \ldots 7$ for $1 \leq S \leq 7$, $R_z = 3, R_y = 4.67 \ldots 6$ for $7 \leq S \leq 9$, and $R_z = 4, R_y = 4.5 \ldots 8$ for $9 \leq S \leq 16$.

9. A data carrier storing a computer program for a magnetic resonance imaging device, the computer program comprising instructions for:

selecting a scheme of subsampling corresponding to a triangular grid and is selected such that the maximum number of folded-over image values is minimized and simultaneously the distances between the positions of the folded-over image values are maximized, acquiring magnetic resonance signals with subsampling in two phase encoding directions in accordance with the selected scheme of subsampling and in correspondence with a user predetermined field of view, reconstructing a three-dimensional image containing folded-over image values, and calculating image values at spatial positions within said field of view from the folded-over image values and sensitivity profiles of receiving antennas.

10. The data carrier as set forth in claim 9, wherein the selecting comprises:

selecting phase encoding steps $\Delta k_y$ and $\Delta k_z$ in the two phase encoding directions in accordance with $$\Delta k_y = \frac{R_y}{FOV_y} \text{ and } \Delta k_z = \frac{R_z}{FOV_z},$$

wherein $FOV_y$ and $FOV_z$ represent the predetermined field of view in the two phase encoding directions respectively, and wherein $R_y$ and $R_z$ represent reduction factors being larger than one, and wherein the reduction factors are selected in accordance with the relation $$\frac{1}{\sqrt{3}} \frac{FOV_y}{R_y} \leq \frac{FOV_z}{R_z} \leq \sqrt{3} \frac{FOV_y}{R_y}.$$

11. The device of claim 1, further comprising:

a visual display unit configured to display an image comprising said calculated image values at spatial positions within said field of view.

12. The method of claim 6, further comprising:

displaying an image comprising said calculated image values at spatial positions within said field of view.

13. The data carrier as set forth in claim 9, wherein the computer program comprises further instructions for:

displaying an image comprising said calculated image values at spatial positions within said field of view.

* * * * *